(12) United States Patent
Werner

(10) Patent No.: US 6,417,542 B2
(45) Date of Patent: Jul. 9, 2002

(54) FIELD EFFECT-CONTROLLED, VERTICAL SEMICONDUCTOR COMPONENT

(75) Inventor: Wolfgang Werner, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/867,490

(22) Filed: May 30, 2001

(30) Foreign Application Priority Data

May 30, 2000 (DE) .......................................... 100 26 925

(51) Int. Cl.⁷ .............................................. H01L 29/76
(52) U.S. Cl. ........................ 257/335; 257/336; 257/341; 257/342
(58) Field of Search ................................ 257/335, 336, 257/337, 339, 341, 342

(56) References Cited

U.S. PATENT DOCUMENTS 5,475,252 A * 12/1995 Merrill et al. ............... 257/341
5,917,203 A * 6/1999 Bhatnagar et al. ........... 257/139
6,114,207 A * 9/2000 Okabe et al. ................ 438/270
6,194,760 B1 * 2/2001 Lee .............................. 257/328
6,225,642 B1 * 5/2001 Liao ............................. 257/3

* cited by examiner

Primary Examiner—Ngân V. Ngô
(74) Attorney, Agent, or Firm—Laurence A. Greenberg; Werner H. Stemer; Gregory L. Mayback

(57) ABSTRACT

The field effect-controlled, vertical semiconductor component is disposed in a semiconductor element and contains at least one internal zone of the first conductivity type, at least one basic zone of the second conductivity type which adjoins the internal zone and a first surface of the semiconductor element, and at least one source zone of the first conductivity type which is disposed in the basic zone. At least one further basic zone of the second conductivity type is spaced apart from the basic zone by an intermediate zone of the first conductivity type, and at least one source contact zone is provided which connects the source zones, the basic zones and the further basic zones to one another with low impedance.

14 Claims, 5 Drawing Sheets

FIELD EFFECT-CONTROLLED, VERTICAL SEMICONDUCTOR COMPONENT

BACKGROUND OF THE INVENTION

Field of the Invention

The invention relates to a field effect-controlled, vertical semiconductor component. The field effect-controlled, vertical semiconductor component is disposed in a semiconductor element and has at least one internal zone of a first conductivity type, at least one basic zone of a second conductivity type which adjoins the internal zone and a first surface of the semiconductor element, and at least one source zone of the first conductivity type which is disposed in each basic zone.

Such field effect-controlled, vertical semiconductor components, which may be embodied as V-MOSFETs, D-MOSFETs, U-MOSFETs, are widely known and have been described in detail, for example, in a reference by B. Jayant Baliga, titled "Power Semiconductor Devices", PWS Publishing Company, pages 336 to 339.

In the off mode of such vertical semiconductor components, voltages may occur which are higher than the breakdown voltage of the semiconductor component. The drain/source off-state current which is caused by this causes, owing to the ohmic resistance in the basic zone, a voltage drop corresponding to the resistance in the basic zone. If the voltage drop exceeds the switch-off voltage of a parasitic diode at the pn junction between the basic zone and the drain zone, a parasitic bipolar transistor, whose emitter, base and collector are formed by the source zone, the basic zone and the drain zone, is undesirably switched on. The undesired switching on of the parasitic bipolar transistor is also referred to as a latch-up effect. In such a case, the off-state voltage of the semiconductor component drops significantly, i.e. by approximately 30% to 50%, which typically leads to the direct destruction of the semiconductor component itself. The latch-up effect is amplified by the fact that the voltage breakdown generally occurs at the edge of the basic zone, which is promoted by the curvature of the pn junction.

In order to improve the immunity to latching up, the resistance of the layer in the basic zone of the semiconductor component should therefore be as small as possible so that the voltage drop occurring here is as small as possible. However, the threshold voltage of the semiconductor component depends to a very high degree on the doping concentration in the basic zone, as a result of which tight limits are set on the reduction of the layer resistance in the basic zone.

If the doping concentration in the basic zone is nevertheless increased in order to reduce the layer resistance and thus improve the immunity to latching up, this additionally entails the risk of crystal fault formation which can be remedied only to a limited degree when a very high dose is used. In addition, when a very high implantation dose is used there is always also the risk of undesired defusing out of dopants into the semiconductor element. However, a semiconductor component in which the basic zones have, in view of all these measures, a very high doping concentration, with correspondingly off-state current densities in the basic zones will nevertheless latch in all cases.

Alternatively, it is possible that when the drain voltage is changed very rapidly a capacitive current flows which leads to a corresponding voltage drop in the basic zone, with the result that the parasitic bipolar transistor is switched on.

It is therefore necessary to ensure that in the off mode the parasitic bipolar transistor of the semiconductor component does not become active, i.e. is not latched, even when the off-state voltage rises above the breakdown voltage or when there is a rapid change in the drain voltage.

SUMMARY OF THE INVENTION

It is accordingly an object of the invention to provide a field effect-controlled, vertical semiconductor component that overcomes the above-mentioned disadvantages of the prior art devices of this general type, in which the possibility of undesired switching on or off of a parasitic transistor is very largely excluded in the off mode.

With the foregoing and other objects in view there is provided, in accordance with the invention, a field effect-controlled, vertical semiconductor component disposed in a semiconductor element. The vertical semiconductor component contains at least one internal zone of a first conductivity type disposed in the semiconductor element, and the semiconductor element has a first surface and a second surface. At least one basic zone of a second conductivity type adjoins the internal zone and the first surface. At least one source zone of the first conductivity type is disposed in the basic zone. An intermediate zone of the first conductivity type is provided. At least one further basic zone of the second conductivity type is disposed in the semiconductor element, the intermediate zone is disposed between the further basic zone and the basic zone for spacing apart the further basic zone from the basic zone. At least one source contact zone connects the source zone, the basic zone and the further basic zone to one another with a low impedance.

Accordingly, a semiconductor component of the type mentioned at the beginning is provided which is characterized by at least one further basic zone of the second conductivity type which is spaced apart from the basic zone by an intermediate zone of the first conductivity type, and at least one source contact zone which connects the source zones, the basic zones and the further basic zones to one another with a low impedance.

The basic principle of the present invention consists in making available different basic zones that are spatially separated from one another. Here, the first basic zone is the actual current-conducting basic zone that is provided for forming the channel in the switched-on state. The further basic zone, which is typically disposed underneath the actual basic zone, is provided in the off mode for receiving an off-state voltage caused by an off-state current. In the off mode, a voltage drop caused by the off-state current occurs exclusively in the further basic zone. The voltage drop in the further basic zone does not, however, lead to charge carrier injection, and thus to switching on the parasitic bipolar transistor; a semiconductor component is thus advantageously made available without a latch-up effect.

A particular advantage of the invention lies, moreover, in the fact that the voltage drop in the further basic zone can be of any desired magnitude without the parasitic bipolar transistor switching on. The doping concentration in the basic zone can thus be adjusted in an optimum way to the setting of the threshold voltage of the semiconductor component; taking into account the immunity to latching up by a suitable selection of the doping concentration plays a small role here. A semiconductor component that advantageously provides greater degrees of freedom to manufacturing technology is thus provided.

The further basic zone is, as already mentioned, usually disposed under the actual basic zone and connected to the basic zone by a highly conductive source contact zone. It is particularly advantageous if the further basic zone is embodied as a layer buried in the internal zone. The highly doped, buried basic zone can typically be introduced into the internal zone by high-dose ion implantation.

In a particularly advantageous embodiment, the further basic zone is composed of two different regions that are disposed one underneath the other and are connected to one another. The two regions each have different penetration depths and different doping concentrations.

It is particularly advantageous if the first region has a high doping concentration and is disposed, with respect to the first surface, above the second region which has a much lower doping concentration. The first highly doped region thus takes up virtually the entire off-state current occurring in the further basic zone, and thus the voltage dropping there. The second region of the further basic zone that has a low doping level advantageously has a compensating effect for the doping in the drain region.

The second region of the further basic zone which has a low doping level takes up, to the benefit of the internal zone (=drain region) a significant proportion of the drain-source voltage, as a result of which the doping of the internal zone can be higher. Owing to the higher doping of the internal zone, the switch-on resistance can advantageously be significantly reduced with the same breakdown voltage, as a result of which the power drain of the current diverter component becomes correspondingly lower.

The further basic zones typically have a significantly higher doping concentration than the actual basic zones. However, it would also be advantageous if the further basic zones had the same doping concentration, or a lower doping concentration, than the actual basic zones. In this case, owing to the higher layer resistance, the vertical extent of the further basic zones can be significantly smaller, which results in the vertical extent of the JFET, and thus the resistance of this part of the semiconductor component, becoming smaller. In general, the further basic zone should be at least doped to such a level that it is not emptied when it is operated.

The basic zones and the further basic zones are electrically connected to one another by the formation of highly conductive, low-impedance contact. This is referred to below as a source contact zone and can be composed, according to a first exemplary embodiment, of very highly doped silicon of the same conductivity type as the base zone and the further base zone. The source contact zones are typically introduced in a trench shape into the semiconductor element from the front side of the wafer. It is particularly advantageous if the doping concentration of the source contact zone is significantly higher than the corresponding doping concentrations in the base zone and further base zone.

In a second exemplary embodiment, the source contact zone can also be embodied by a highly conductive metal stopper, which contains, for example, tungsten or an alloy containing tungsten.

In a third exemplary embodiment, the source contact zone can also be embodied by a silicide, for example platinum silicon (PtSi) which is applied to a trench wall and which is filled in with highly doped polysilicon.

A field effect-controlled semiconductor component according to the invention may be embodied as a vertical transistor structure, for example as a D-MOSFET, V-MOSFET, U-MOSFET etc. Such transistor structures are essentially a three-layered structure composed of the drain zone, the basic zone and the source zone. If the transistor structure is embodied as a power semiconductor component, an internal zone as a drift path, which has lower doping than the drain zone, is disposed between the basic zone and the drain zone. The source zone, the drain zone and, if appropriate, the internal zone have the same conductivity type, and the basic zone which is provided in order to form a channel zone by controlling the gate electrode has the opposite conductivity type.

Alternatively, the semiconductor component may also be embodied as a vertical insulated gate bipolar transistor (IGBT). In this case, an anode zone of the opposite conductivity type to that of the drain zone is provided between the drain zone and the rear metallization.

In the case of semiconductor components that are embodied as U-MOS's or V-MOS's, trenches are made in the semiconductor element in which the control electrodes are disposed. The trenches may be rectangular, U-shaped, V-shaped, trapezoidal etc. In the case of trench-shaped semiconductor components, the trenches extend from the front side of the wafer via the source zone, the basic zone, the intermediate zone, the further basic zone and into the internal zone of the semiconductor component. For structural reasons, two different channels are formed here by controlling the control electrode, i.e. a first channel is formed in the basic zone and a second channel is formed in the further basic zone. The particular advantage of such trench-shaped semiconductor components lies in the fact that the channels can be significantly shorter than in the case of lateral semiconductor components. The semiconductor components with a trench structure can thus be embodied with a significantly smaller pitch between two adjacent cells. This particularly advantageous exemplary embodiment thus provides not only improved immunity to latching up but also the advantage of a smaller pitch, which additionally improves the switch-on resistance.

In accordance with an added feature of the invention, a dielectric material is provided along with at least one control electrode adjoining the basic zone at the first surface and is spaced apart from the basic zone by the dielectric material. The basic zone generates at least one channel zone in a switched-on state when the control electrode is driven. At least one source electrode makes contact with the source contact zone at the first surface. A drain zone of the first conductivity type is disposed in the internal zone. At least one drain electrode makes contact over a large area with the drain zone.

In accordance with an additional feature of the invention, an anode region of the second conductivity type is disposed between the drain zone and the second surface.

In accordance with another feature of the invention, the semiconductor element has at least one trench formed therein, and has a control electrode disposed in the trench.

In accordance with a further feature of the invention, the trench extends from the first surface through the source zone, the basic zone, the intermediate zone, and the further basic zone, disposed in succession, as far as into the internal zone. It being possible to generate at least one further channel zone in the further basic zone by controlling the source contact zone.

Other features which are considered as characteristic for the invention are set forth in the appended claims.

Although the invention is illustrated and described herein as embodied in a field effect-controlled, vertical semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
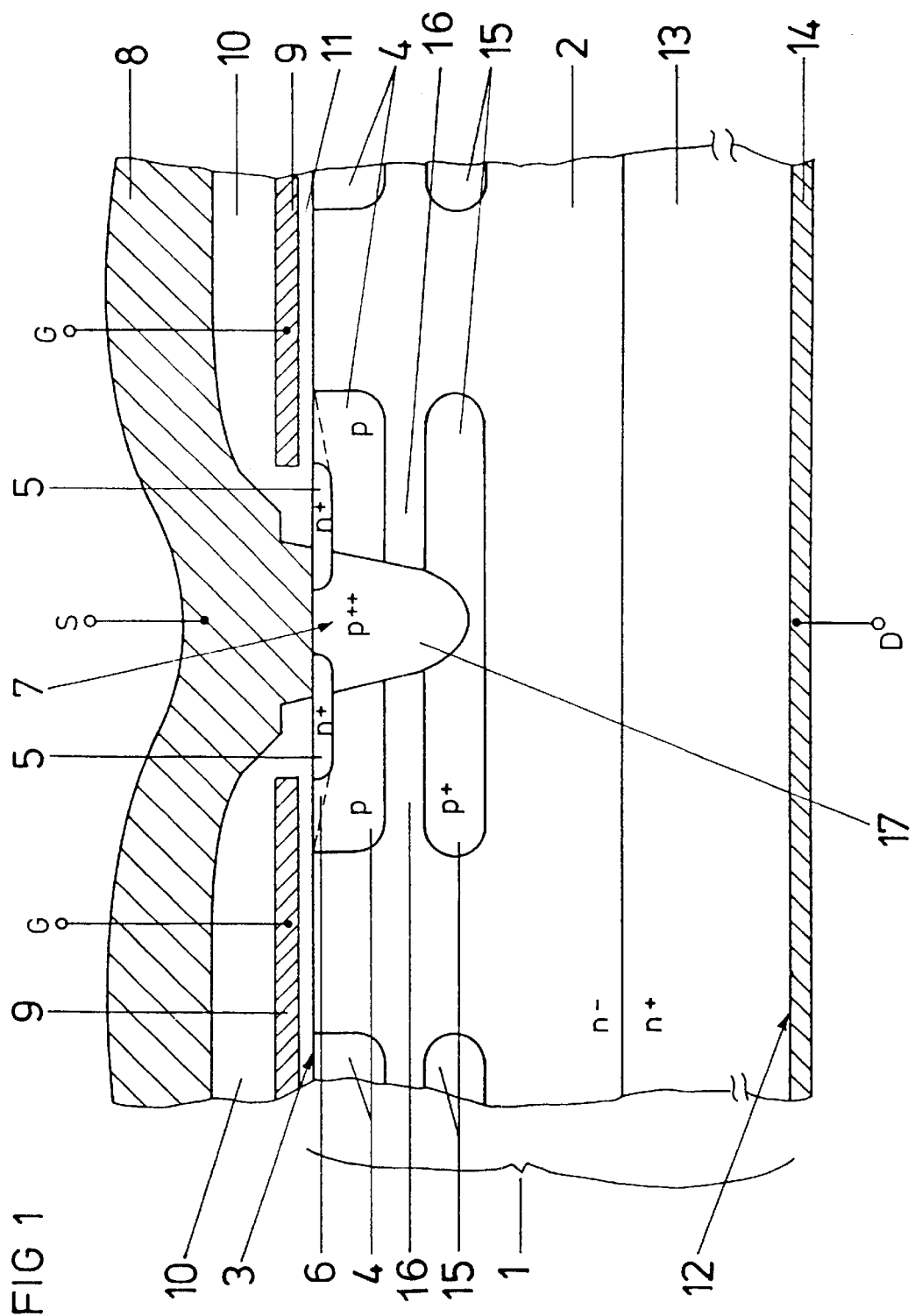
FIG. 1 is a diagrammatic, sectional view of a first exemplary embodiment of a semiconductor component according to the invention with two base zones which are separated from one another.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of a semiconductor component according to the invention in a partial section view. In FIG. 1, 1 designates a semiconductor element—for example made of silicon. The semiconductor element 1 has an n--doped internal zone 2. A p-type doped basic zone 4 is embedded in the internal zone 2 at a first surface 3. In turn two n+-type doped source zones 5 are embedded in the basic zone 4 in such a way that the basic zone 4 adjoins the surface 3 of the semiconductor element 1 at various regions 6, 7, and is covered by the source zones 5 in the other regions. The regions 6, 7 that adjoin the surface are the channel zones 6 and the contact region 7 that is connected to a source electrode 8. In addition, a gate electrode 9 is provided for controlling the channel zone 6, and it is spaced apart from or insulated from the source electrode 8 by an oxide 10 and from the semiconductor element 1 in the region of the channel zone 6 by a dielectric material 11. The gate electrode 9 is disposed above the semiconductor component 1 in such a way that at least the region adjoining the surface 3 of the basic zone 4 is covered by the gate electrode 9.

An n+-type doped drain zone 13 is provided on the rear of the semiconductor element 1 between a second surface 12 and the internal zone 2. The drain zone 13 is in contact with the second surface 12 over a large area by a drain electrode 14.

FIG. 1 thus illustrates a vertical semiconductor component which is embodied as a D-MOSFET and in which the source electrode 8 with a source terminal S, and the gate electrode 9 with a gate terminal G, are disposed on the front side 3 of the wafer of the semiconductor element 1, and the drain electrode 14 is connected to the drain terminal D at the rear of the wafer.

The gate electrode 9 is typically made of highly doped polysilicon, but could also be composed of a metallization made in the conventional way or a silicide. The source electrode 8 and the drain electrode 14 are embodied as conventional metallizations, for example of aluminum, copper, gold etc. The dielectric 11 between the gate electrode 9 and semiconductor element 1 as well as the oxide 10 have typically been made from silicon dioxide ($SiO_2$), but they can, of course, be embodied by other materials, for example silicon nitride ($Si_3N_4$).

According to the invention, a further p+-doped basic zone 15 is provided. In the exemplary embodiment according to FIG. 1, the further basic zone 15 is illustrated as a layer which is buried in the internal zone 2, which is disposed underneath the actual basic zone 4 and which can have a higher doping concentration than the actual basic zone 4. It is essential here that the further basic zone 15 is spatially separated from the actual basic zone 4 by an intermediate zone 16 which is a component of the internal zone 2 in FIG. 1.

In addition, a highly conductive source contact zone 17, which is p++-doped in the present exemplary embodiment is provided, the source contact zone 17 ensuring that the basic zone 4 and the further basic zone 15 are electrically connected to one another with a low impedance, and to the source electrode 8. The basic zone 4 is connected to the source zone 5 via a shunt to the source electrode 8.

Figure 2:
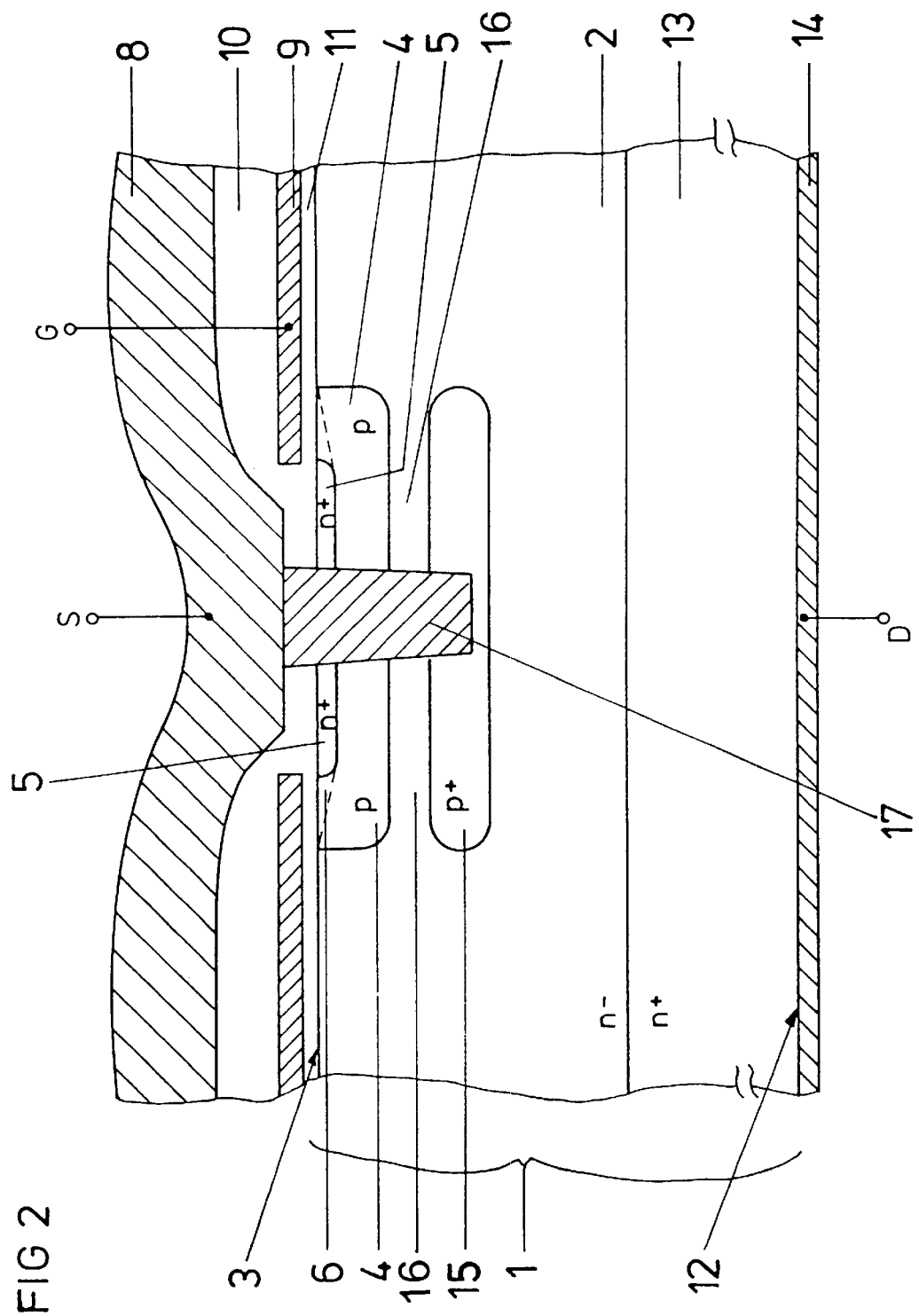
FIG. 2 is a sectional view of a second exemplary embodiment of the semiconductor component.

FIG. 2 shows a second exemplary embodiment of the semiconductor component according to the invention in which the source contact zone 17 is embodied as a "tungsten stopper". The tungsten stopper 17 is composed of tungsten or of an alloy containing tungsten and thus provides a low-impedance, highly conductive electrical connection between the basic zone 4, the further basic zone 15, the source zones 5 and the source electrode 8. In this context, it would, of course, also be conceivable to use for the contacts some other electrically conductive material, for example aluminum, copper, gold, platinum etc., instead of tungsten. All that needs to be noted here is that a good electrical, i.e. ohmic contact is ensured at the metal/semiconductor junction between the respective metallic "contact stopper" 17 and the respective basic zones 4, 15.

Figure 3:
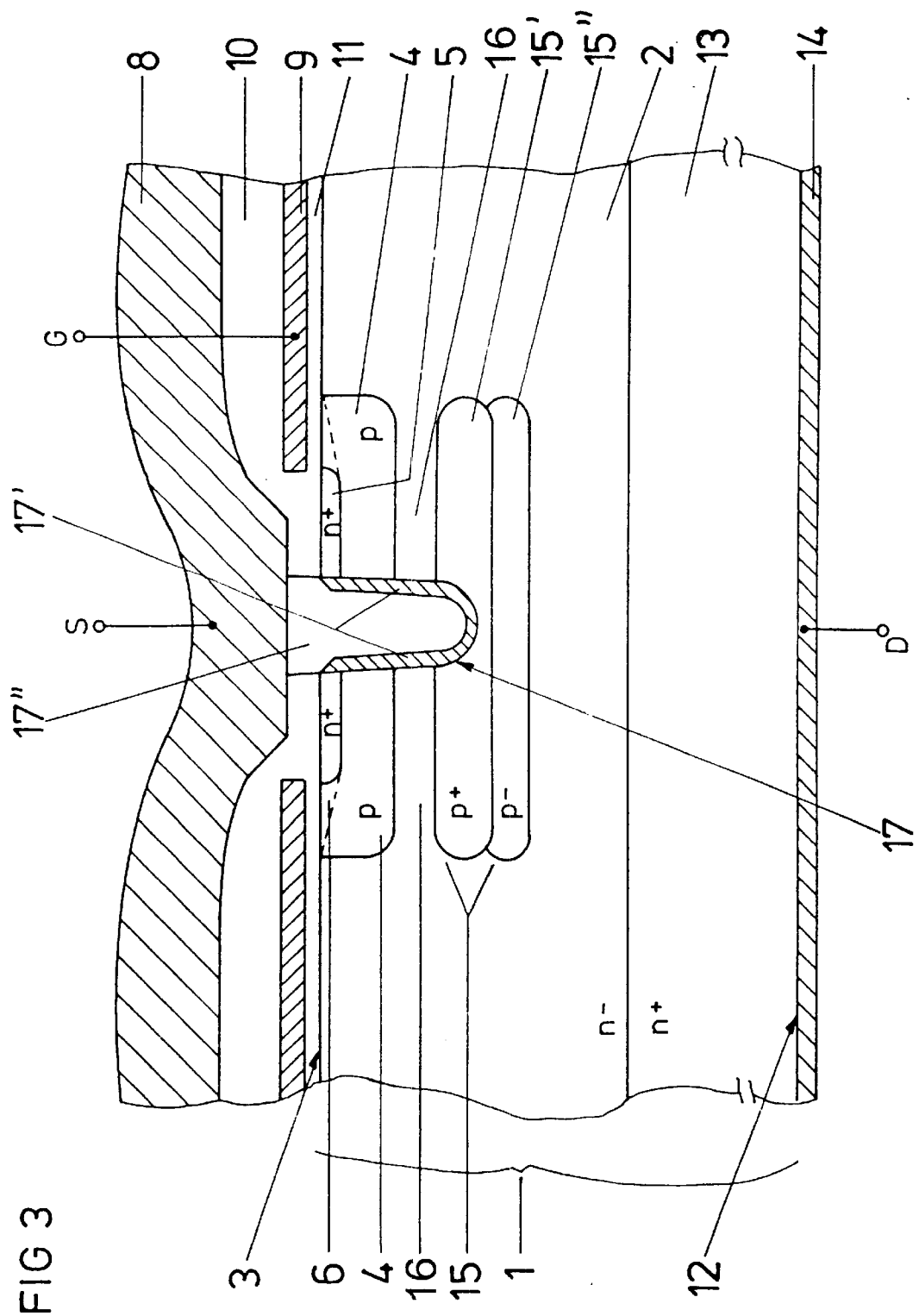
FIG. 3 is a sectional view of a third exemplary embodiment of the semiconductor component.

FIG. 3 shows a third exemplary embodiment of the semiconductor component according to the invention in which the source contact zone 17 has been provided in the semiconductor element 1 in trench form, and a silicide 17' has been applied to the trench walls. Remaining regions 17" of the source contact zone 17 are filled in with a highly doped polysilicon. The silicide 17', which may be embodied for example as a platinum silicide (PtSi) ensures in turn a low-impedance connection between the basic zones 4, 15 which are spaced apart from one another and the source zones 5.

Moreover, the further basic zone 15 has two regions 15', 15", a p-type doped first region 15' being connected to a p--type doped second region 15". The two regions 15', 15" are typically provided in the semiconductor element 1 by two different implantation steps with different doping doses and penetration depths.

The method of operation of the semiconductor component according to FIGS. 1 to 3 that is embodied according to the invention as a MOSFET will be explained in more detail below.

If the MOSFET is operated in a transmitting mode, the n-type doped channel zone 6 can be produced by controlling the gate electrode 9, given a sufficiently high positive gate potential at the boundary layer of the p-type doped basic zone 4. A current path is then formed from the drain terminal D via the drain zone 13, the internal zone 2, the channel zone 6 to the source zone 5 and thus to the source terminal S. In the off mode, the gate electrode 9 has a negative potential or a zero potential, so that a channel zone 6 cannot be formed.

When a drain-source off-state voltage is applied, the off-state current only continues to flow through the further basic zone 15, and causes a drop in voltage there. The drop in voltage can advantageously also be greater than the forward voltage. The voltage drop in the further basic zone 15 does not, however, any longer lead to charge carrier injection and thus to switching on of the bipolar transistor because the base and the collector of the parasitic bipolar transistor are now completely isolated from its emitter (=source zone). Undesired switching on of a parasitic bipolar transistor is basically no longer possible with the structure corresponding to FIGS. 1 to 3.

Moreover, even a voltage drop caused by an off-state current in the further basic zone 15 may be significantly greater than in the case of structures corresponding to the prior art which are embodied without a further basic zone 15.

It is also advantageous that the vertical extent of the further basic zone 15 can be significantly smaller owing to its lower doping concentration and thus higher layer resistance, which results in the vertical extent of the JFET, and also the resistance of this part of the semiconductor component, becoming smaller. This is even advantageous because, owing to the voltage drop in the further basic zone 15, the location of a voltage breakdown is displaced from the outer edge of the further basic zone 15 to its center. As a result, the risk of charge carriers—in the present case these are holes—getting into the actual basic zone 4 and causing the parasitic bipolar transistor to switch off in the event of an avalanche breakdown is reduced.

Figure 4:
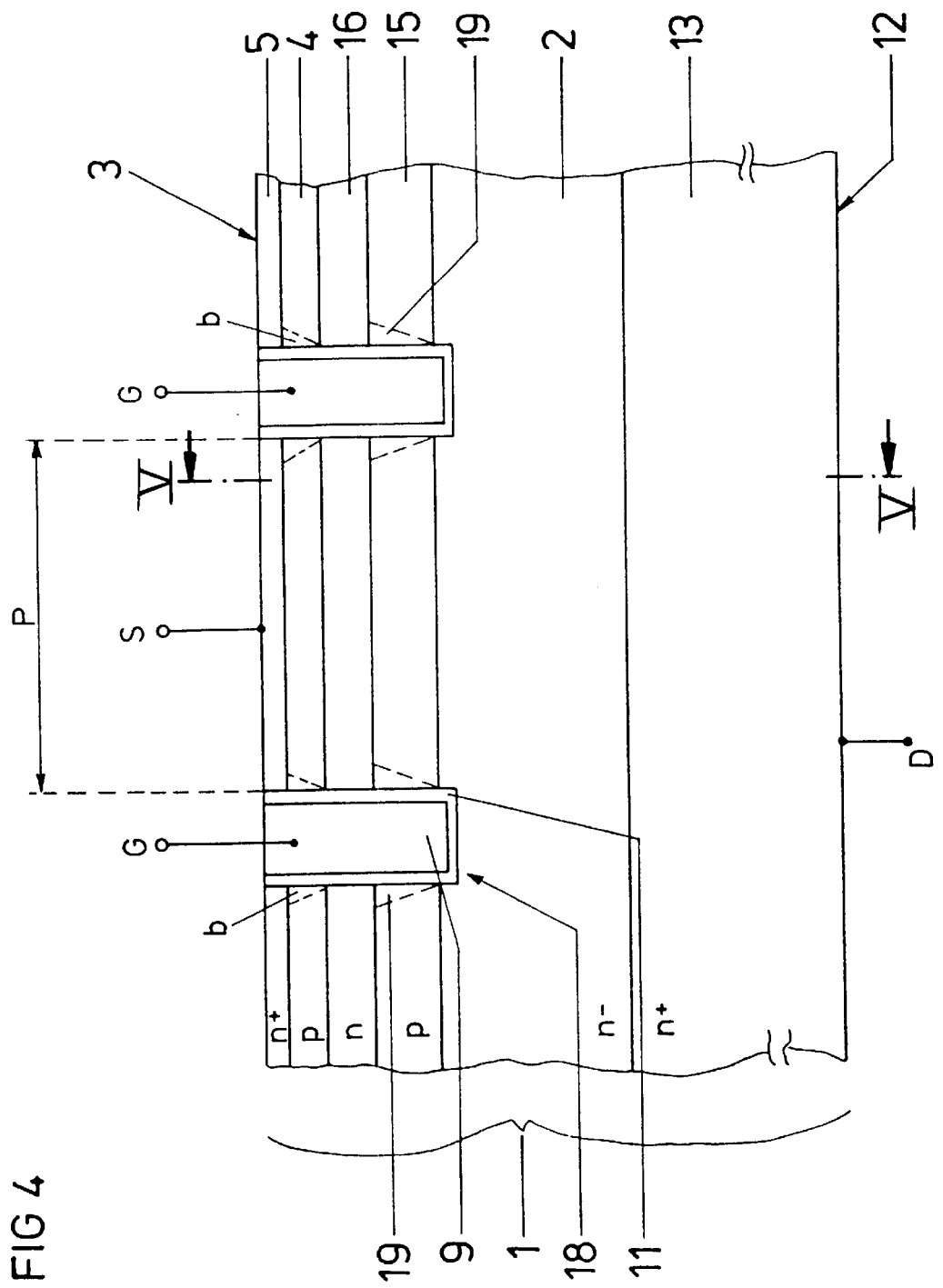
FIG. 4 is a sectional view of a fourth exemplary embodiment of the semiconductor component.
Figure 5:
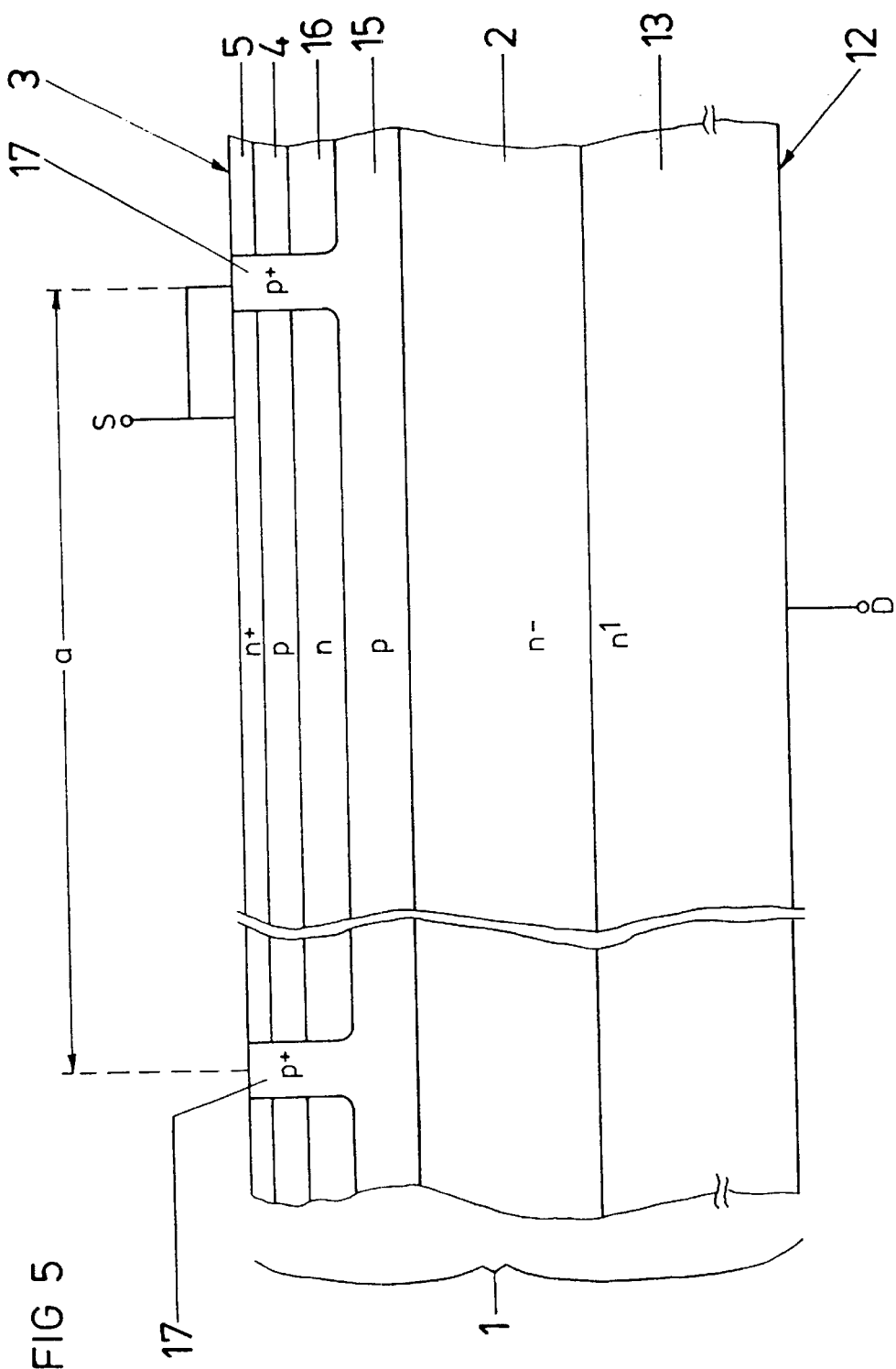
FIG. 5 is a cross-section view through the semiconductor component taken along the line V—V shown in FIG. 4.

FIG. 4 shows a fourth exemplary embodiment of the semiconductor component in a partially sectional view, and FIG. 5 shows a cross section along the line V—V in FIG. 4. In FIGS. 4 and 5, all the metallizations and electrodes have not been shown, with the exception of the gate electrodes, for the sake of better clarity.

In FIG. 4, trenches 18 in which the gate electrodes 8 and the gate oxide 11 are disposed are provided in the semiconductor element 1. The trenches 18 extend here from the front side 3 of the wafer via the source zones 5 and the basic zone 4, the intermediate zone 16, the further basic zone 15 and as far as into the internal zone 2. In each case two channel zones 6, 19, which are each disposed in the basic zones 4, 15 in the direct vicinity of the gate electrodes 9, are provided here. The channel zone 6 is necessary here so that the intermediate zone 16 can float between the two basic zones 4, 15, i.e. has an undefined potential. An off-state current via the pn-type junction of the internal zone 2 and of the further basic zone 15 can thus flow away exclusively via the further basic zone 15. The channel length of the channel zone 6 can advantageously be selected to be very short here because the maximum off-state voltage applied to the basic zone 4 corresponds to the voltage drop in the further basic zone 15, which is caused by the corresponding off-state current.

FIGS. 4 and 5 show a semiconductor component that is embodied as a U-MOSFET, but the semiconductor component could also be embodied as a V-MOSFET, for example by V-shaped trenches.

The basic zones 4, 15 may be disposed at a very large distance a apart—for example between 20 to 100 mm—between two adjacent source contact zones 17. The semiconductor component according to the invention provides not only the improved immunity to latching up but also the advantage of a very small pitch p, which has a particularly advantageous effect on the switch-on resistance RON.

Semiconductor components embodied as MOSFETs have been illustrated in the figures of the drawing. However, the invention is also equally suitable for other vertical semiconductor components, for example insulated-gate bipolar transistors (IGBTs) and thyristors in which the switching on of a parasitic bipolar transistor is to be suppressed by suitable measures. In the case of a semiconductor component which is embodied as an IGBT, just one anode zone (not illustrated in the figures) would have to be disposed between the drain zone 13 and rear 12 of the wafer on the structures corresponding to FIGS. 1 to 4.

For all the exemplary embodiments of FIGS. 1 to 5, it is of course possible to provide new possible exemplary embodiments by exchanging all the n conduction types for p conduction types. Furthermore, the invention is not exclusively restricted to normally off semiconductor components, but rather can also be extended to normally on semiconductor components within the scope of the invention.

In summary, it is possible to note that the semiconductor component according to the invention which is embodied and operated as described ensures, with little additional outlay, an optimum latching up protection with simple measures, without the need simultaneously to tolerate the disadvantages of semiconductor components according to the prior art. Moreover, the semiconductor component according to the invention is more independent in terms of the selection of doping concentrations in the basic zone, and thus permits greater degrees of freedom in the manufacturing technology.

The present invention has been presented in the description above in order to explain most satisfactorily the principle of the invention and its practical application. Of course, the present invention can also be suitably implemented in a wide range of embodiments and refinements within the scope of the actions and knowledge of a person skilled in the art.

I claim:

1. A field effect-controlled, vertical semiconductor component disposed in a semiconductor element, comprising:
    at least one internal zone of a first conductivity type disposed in the semiconductor element, the semiconductor element having a first surface and a second surface;
    at least one basic zone of a second conductivity type adjoining said internal zone and the first surface;
    at least one source zone of said first conductivity type disposed in said basic zone;
    an intermediate zone of said first conductivity type;
    at least one further basic zone of said second conductivity type disposed in the semiconductor element, said intermediate zone disposed between said further basic zone and said basic zone for spacing apart said further basic zone from said basic zone; and
    at least one source contact zone connecting said source zone, said basic zone and said further basic zone to one another with a low impedance.

2. The semiconductor component according to claim 1, wherein said further basic zone is disposed underneath said basic zone with respect to the first surface and is embodied as a buried layer in said internal zone, and said intermediate zone is a component of said internal zone.

3. The semiconductor component according to claim 1, wherein said further basic zone contains at least two regions which are each connected to one another, and each have different penetration depths into the semiconductor element and have different doping concentrations.

4. The semiconductor component according to claim 3, wherein said two regions include a first region and a second region having a lower doping concentration than said first region, said second region disposed underneath said first region with respect to the first surface.

5. The semiconductor component according to claim 1, wherein said further basic zone has a vertical extent less than a vertical extent of said basic zone.

6. The semiconductor component according to claim 5, wherein said source contact zone contains a highly doped material of said second conductivity type, and said source contact zone has a higher doping concentration than at least one of said basic zone and said further basic zone.

7. The semiconductor component according to claim 1, wherein said source contact zone is formed of a material selected from the group containing tungsten and an alloy containing said tungsten.

8. The semiconductor component according to claim 1, wherein said source contact zone contains a silicide and a highly doped polysilicon.

9. The semiconductor component according to claim 1, including:
   a dielectric material;
   at least one control electrode adjoining said basic zone at the first surface and is spaced apart from the basic zone by said dielectric material, said basic zone generating at least one channel zone in a switched-on state when said control electrode is driven;
   at least one source electrode making contact with said source contact zone at said first surface;
   a drain zone of said first conductivity type disposed in said internal zone; and
   at least one drain electrode making contact over a large area with said drain zone.

10. The semiconductor component according to claim 9, including an anode region of said second conductivity type disposed between said drain zone and the second surface.

11. The semiconductor component according to claim 1, wherein said semiconductor element has at least one trench formed therein, and including a control electrode disposed in said trench.

12. The semiconductor component according to claim 11, wherein said trench extends from the first surface through said source zone, said basic zone, said intermediate zone, and said further basic zone, disposed in succession, as far as into said internal zone, it being possible to generate at least one further channel zone in said further basic zone by controlling said source contact zone.

13. The semiconductor component according to claim 1, including:
   a dielectric material;
   at least one control electrode adjoining said basic zone at the first surface and is spaced apart from the basic zone by said dielectric material, said basic zone generating at least one channel zone in a switched-on state when said control electrode is driven;
   at least one source electrode making contact with said source contact zone at said first surface; and
   at least one drain electrode making contact over a large area with the semiconductor element.

14. The semiconductor component according to claim 1, wherein said semiconductor element has at least one trench formed therein, and including a control electrode and a dielectric material disposed in said trench.

* * * * *